(12) United States Patent
Cheng et al.

(10) Patent No.: US 10,586,741 B2
(45) Date of Patent: Mar. 10, 2020

(54) GATE HEIGHT AND SPACER UNIFORMITY

(71) Applicant: International Business Machines Corporation, Armonk, NY (US)

(72) Inventors: Kangguo Cheng, Schenectady, NY (US); Lawrence A. Clevenger, Rhinebeck, NY (US); Balasubramanian S. Pranatharthi Haran, Watervliet, NY (US); John Zhang, Altamont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 159 days.

(21) Appl. No.: 15/608,476

(22) Filed: May 30, 2017

(65) Prior Publication Data

US 2018/0122710 A1    May 3, 2018

Related U.S. Application Data

(63) Continuation of application No. 15/339,402, filed on Oct. 31, 2016, now Pat. No. 9,704,991.

(51) Int. Cl.
| | |
|---|---|
| *H01L 21/8238* | (2006.01) |
| *H01L 29/78* | (2006.01) |
| *H01L 29/66* | (2006.01) |
| *H01L 21/8234* | (2006.01) |
| *H01L 21/033* | (2006.01) |
| *H01L 21/311* | (2006.01) |

(52) U.S. Cl.
CPC .......... *H01L 21/823864* (2013.01); *H01L 21/823437* (2013.01); *H01L 21/823462* (2013.01); *H01L 21/823828* (2013.01); *H01L 29/6653* (2013.01); *H01L 29/66545* (2013.01); *H01L 29/66628* (2013.01); *H01L 29/7827* (2013.01); *H01L 21/0337* (2013.01); *H01L 21/31144* (2013.01); *H01L 21/823425* (2013.01); *H01L 21/823468* (2013.01); *H01L 21/823487* (2013.01)

(58) Field of Classification Search
CPC .................................................. H01L 21/8238
See application file for complete search history.

(56) References Cited

U.S. PATENT DOCUMENTS

| | | | |
|---|---|---|---|
| 6,894,353 | B2 | 5/2005 | Samavedam et al. |
| 8,623,714 | B2 | 1/2014 | Park et al. |
| 8,664,125 | B2 | 3/2014 | Raley et al. |

(Continued)

OTHER PUBLICATIONS

List of IBM Patents or Patent Applications Treated as Related (Appendix P); Filed May 30, 2017, 2 pages.

(Continued)

*Primary Examiner* — Marvin Payen
(74) *Attorney, Agent, or Firm* — Cantor Colburn LLP; Joseph Petrokaitis

(57) ABSTRACT

Embodiments are directed to a method of forming a semiconductor device and resulting structures having self-aligned spacer protection layers. The method includes forming a first sacrificial gate adjacent to a second sacrificial gate on a substrate. A dielectric layer is formed on the substrate and above top surfaces of the first and second sacrificial gates. A self-aligned protection region is formed to cover a first portion of the dielectric layer and a second uncovered portion of the dielectric layer is removed. The first portion of the dielectric layer defines a spacer after the second portion of the dielectric layer is removed.

20 Claims, 13 Drawing Sheets

(56) References Cited

U.S. PATENT DOCUMENTS

| | | |
|---|---|---|
| 8,735,272 B2 | 5/2014 | Cai et al. |
| 8,841,726 B2 | 9/2014 | Leobandung |
| 8,962,472 B2 | 2/2015 | Rho et al. |
| 8,993,445 B2 | 3/2015 | Choi et al. |
| 9,054,178 B2 | 6/2015 | Bohr et al. |
| 9,111,746 B2 | 8/2015 | Ranjan et al. |
| 9,159,567 B1 | 10/2015 | Xiao et al. |
| 9,269,590 B2 | 2/2016 | Luere et al. |
| 9,269,792 B2 | 2/2016 | Cheng et al. |
| 2009/0170297 A1 | 7/2009 | Joung et al. |
| 2011/0198673 A1 | 8/2011 | Bonser et al. |
| 2012/0196425 A1 | 8/2012 | Scheiper et al. |
| 2013/0221413 A1 | 8/2013 | Jagannathan et al. |
| 2014/0011303 A1 | 1/2014 | Meng |
| 2015/0102430 A1 | 4/2015 | Hui et al. |
| 2015/0111373 A1 | 4/2015 | Cote et al. |
| 2015/0200111 A1 | 7/2015 | Muralidharan et al. |
| 2015/0287827 A1 | 10/2015 | Leobandung et al. |

OTHER PUBLICATIONS

U.S. Appl. No. 15/339,402, filed Oct. 31, 2016; Entitled: "Gate Height and Spacer Uniformity".

GATE HEIGHT AND SPACER UNIFORMITY

DOMESTIC AND/OR FOREIGN PRIORITY

This application is a continuation of U.S. application Ser. No. 15/339,402, titled "GATE HEIGHT AND SPACER UNIFORMITY" filed Oct. 31, 2016, the contents of which are incorporated by reference herein in its entirety.

BACKGROUND

The present invention relates in general to semiconductor device fabrication methods and resulting structures. More specifically, the present invention relates to fabrication methods and resulting structures for a semiconductor device having self-aligned spacer protection layers that improve gate height and spacer uniformity.

In contemporary semiconductor device fabrication processes a large number of semiconductor devices, such as field effect transistors (FETs) and on-chip capacitors, are fabricated on a single wafer. Some non-planar device architectures, such as vertical field effect transistors (VFETs), employ semiconductor fins and side-gates that can be contacted outside the active region, resulting in increased device density and some increased performance over lateral devices. In contemporary VFET devices, in contrast to conventional FETs, the source to drain current flows through a vertical pillar in a direction that is perpendicular with respect to a horizontal major surface of the wafer or substrate. A VFET can achieve a smaller device footprint because its channel length is decoupled from the contacted gate pitch.

SUMMARY

According to one or more embodiments of the present invention, a method of fabricating a semiconductor device having self-aligned spacer protection layers is provided. The method can include forming a first sacrificial gate adjacent to a second sacrificial gate on a substrate. The method can include forming a dielectric layer on the substrate and above top surfaces of the first and second sacrificial gates. The method can include forming a self-aligned protection region to cover a first portion of the dielectric layer. The method can include removing a second uncovered portion of the dielectric layer. The first portion of the dielectric layer defines a spacer after the second portion of the dielectric layer is removed.

According to one or more embodiments of the present invention, a method of fabricating a semiconductor device having self-aligned spacer protection layers is provided. The method can include forming a plurality of adjacent sacrificial gates on a substrate. The method can include forming a hard mask on a top surface of each sacrificial gate and forming a dielectric layer on the substrate and above the top surfaces of the sacrificial gates. The method can include forming a protection layer over the dielectric layer and the hard masks and removing portions of the protection layer to expose portions of the dielectric layer between each pair of adjacent sacrificial gates. The remaining portions of the protection layer define self-aligned protection regions. The method can include removing the exposed portions of the dielectric layer to expose a surface of the substrate between each pair of adjacent sacrificial gates. The remaining portions of the dielectric layer each define a spacer on a sidewall of a sacrificial gate. The method can include removing the hard masks while the self-aligned protection regions protect the spacers.

According to one or more embodiments of the present invention, a structure having self-aligned spacer protection layers is provided. The structure can include a first gate having a first gate height on a substrate. The structure can include a second gate having a second gate height on the substrate and adjacent to the first gate. The structure can include a first and second spacer on opposite sidewalls of the first gate and a third and forth spacer on opposite sidewalls of the second gate. The first gate height is substantially equal to the second gate height. A thickness of the first, second, third, and forth spacers is substantially equal.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
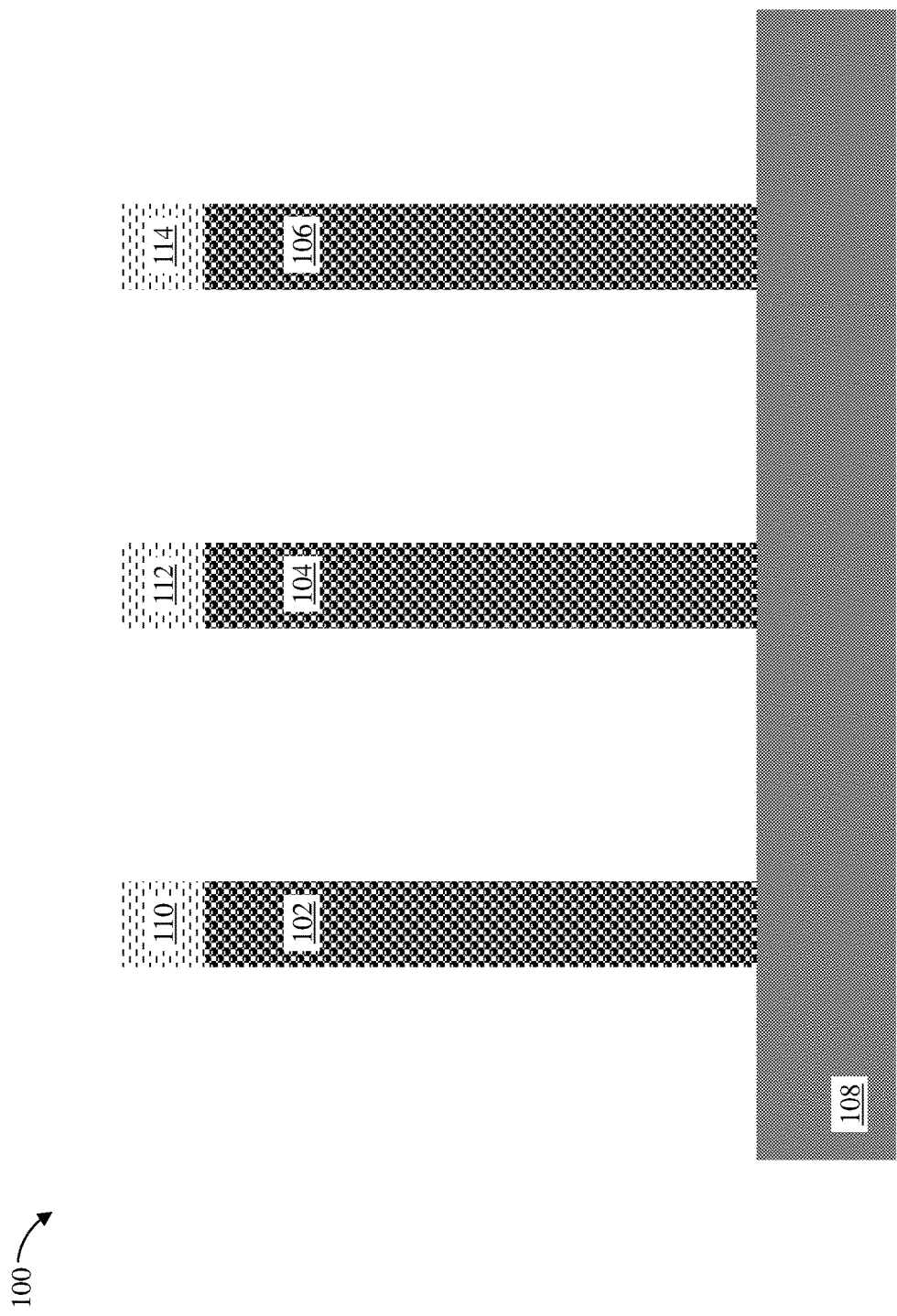
FIG. 1 depicts a cross-sectional view of a structure having sacrificial gates formed on a substrate during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. The term "selective to," such as, for example, "a first element selective to a second element," means that a first element can be etched and the second element can act as an etch stop. The term "conformal" means that the thickness of, e.g., a conformal liner, is substantially the same on all surfaces, or that the thickness variation is less than 15% of the nominal thickness.

As used herein, the terms "about," "substantially," "approximately," and variations thereof are intended to include the degree of error associated with measurement of the particular quantity based upon the equipment available at the time of filing the application. For example, "about" can include a range of±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to the present invention, as previously noted herein, non-planar device architectures such as vertical fin FET devices result in increased device density over lateral devices. There are challenges, however, in providing non-planar architectures for scaling beyond the 10 nm node. For example, as gate pitch continues to shrink it becomes increasingly difficult to form uniform spacers (also known as gate spacers). Spacers formed using thick film depositions at a tight gate pitch (i.e., a gate pitch of less than about 100 nm) are susceptible to pinch off while spacers formed using thin film depositions at a tight gate pitch are susceptible to spacer breakdown. Thus, conventional spacer fabrication processes face a trade off between pinch off and spacer breakdown. Another related challenge in conventional spacer fabrication processes is the inadvertent production of spacer divots during spacer hard mask etching steps. These spacer divots greatly affect gate height uniformity, even when adding additional divot filling steps to the fabrication process. Thus, a method is desired for forming a semiconductor device having both spacer and gate height uniformity that is not susceptible to spacer divots.

Turning now to an overview of the aspects of the present invention, one or more embodiments provide methods of fabricating a semiconductor device having self-aligned spacer protection layers. The self-aligned spacer protection layers serve two purposes: first, the self-aligned spacer protection layers are used to form self-aligned uniform spacers; and second, the self-aligned spacer protection layers prevent the formation of spacer divots during spacer hard mask etching steps. Consequently, spacer and gate height uniformity can be achieved even for a tight gate pitch. Moreover, divot filling steps can be removed from the overall processing scheme.

Example methods for fabricating a semiconductor device having self-aligned spacer protection layers and the resulting structures therefrom in accordance with embodiments of the present invention are described in detail below by referring to the accompanying drawings in FIGS. 1-13.

FIG. 1 illustrates a cross-sectional view of a structure 100 having sacrificial gates 102, 104, and 106 formed on a substrate 108 during an intermediate operation of a method of fabricating a semiconductor device according to one or more embodiments. For ease of discussion reference is made to operations performed on and to a substrate having three adjacent sacrificial gates. It is understood, however, that the substrate 108 can include any number of sacrificial gates. In some embodiments, the gate pitch, or centerline to centerline spacing, between each pair of adjacent sacrificial gates (e.g., between sacrificial gates 102 and 104) can be less than about 150 nm. In other embodiments, the gate pitch is less than about 100 nm, or less than about 40 nm. In some embodiments, the gate pitch between each pair of adjacent sacrificial gates is substantially equal.

The sacrificial gates 102, 104, and 106 can be formed on the substrate 108 using known semiconductor fabrication techniques. For example, in some embodiments, a hard mask is formed over a sacrificial layer and lithographically patterned using a photoresist (not depicted) to form the hard masks 110, 112, and 114. Exposed portions of the sacrificial layer can then be then removed to form the sacrificial gates 102, 104, and 106. Portions of the patterned hard mask can be removed using an etch process, which can be a wet etch process, a dry etch process, or a combination thereof. The sacrificial gates 102, 104, and 106 can be of any suitable material, such as, for example, poly silicon. In some embodiments, each of the sacrificial gates 102, 104, and 106 is formed over a channel region of a semiconductor fin (not depicted).

Hard masks 110, 112, and 114 are formed on a top surface of the sacrificial gates 102, 104, and 106, respectively. The hard masks 110, 112, and 114 can be any suitable material, such as, for example, a nitride or a silicon nitride. In some embodiments, the hard masks 102, 104, and 106 are silicon dioxide hard masks.

The substrate 108 can be any suitable substrate material, such as, for example, monocrystalline Si, SiGe, SiC, III-V compound semiconductor, II-VI compound semiconductor, or semiconductor-on-insulator (SOI). In some embodiments, the substrate 108 includes a buried oxide layer (BOX).

Figure 2:
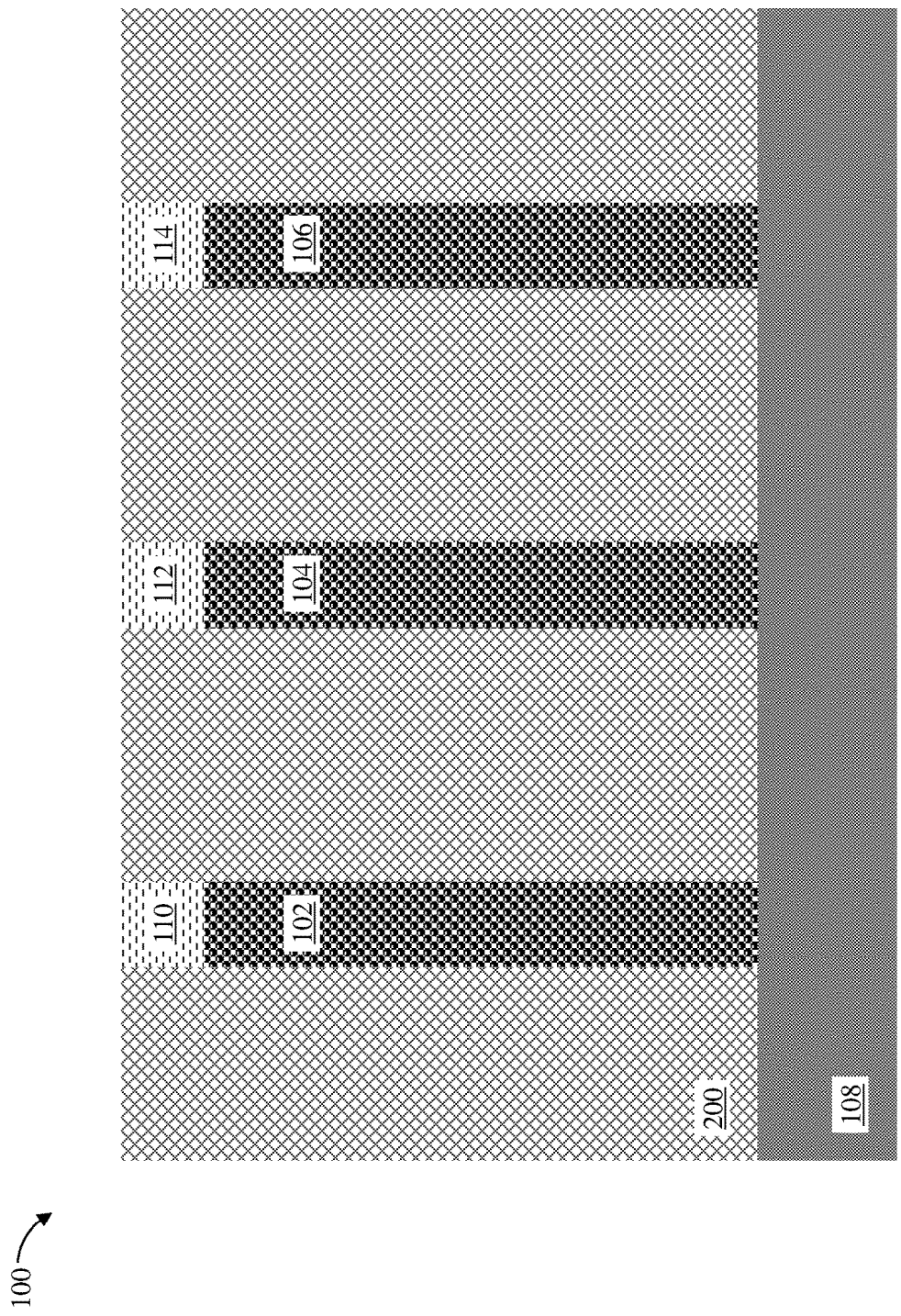
FIG. 2 depicts a cross-sectional view of the structure after forming a first dielectric layer on the substrate during an intermediate operation of a method of fabricating a semiconductor device according to one or more embodiments of the present invention.

FIG. 2 illustrates a cross-sectional view of the structure 100 after forming a first dielectric layer 200 on the substrate 108 during an intermediate operation of a method of fabricating a semiconductor device according to one or more embodiments. The first dielectric layer 200 can be any suitable material, such as, for example, a low-k dielectric, a silicon nitride, silicon dioxide, a silicon oxynitride (SiON), a silicon carbide (SiC), a silicon oxygen carbonitride (SiOCN), a silicoboron carbonitride (SiBCN), or other dielectric materials. Any known manner of forming the first dielectric layer 200 can be utilized. The first dielectric layer 200 can be formed using, for example, CVD, PECVD, ALD, flowable CVD, spin-on dielectrics, or PVD. In some embodiments, the first dielectric layer 200 is formed by a flowable silicon nitride deposition. In some embodiments, the first dielectric layer 200 is planarized to a top surface of the hard masks 110, 112, and 114, using, for example, a CMP operation. In some embodiments, the first dielectric layer 200 is planarized using a wet or dry etch process. In some embodiments, the first dielectric layer 200 is planarized using RIE.

Figure 3:
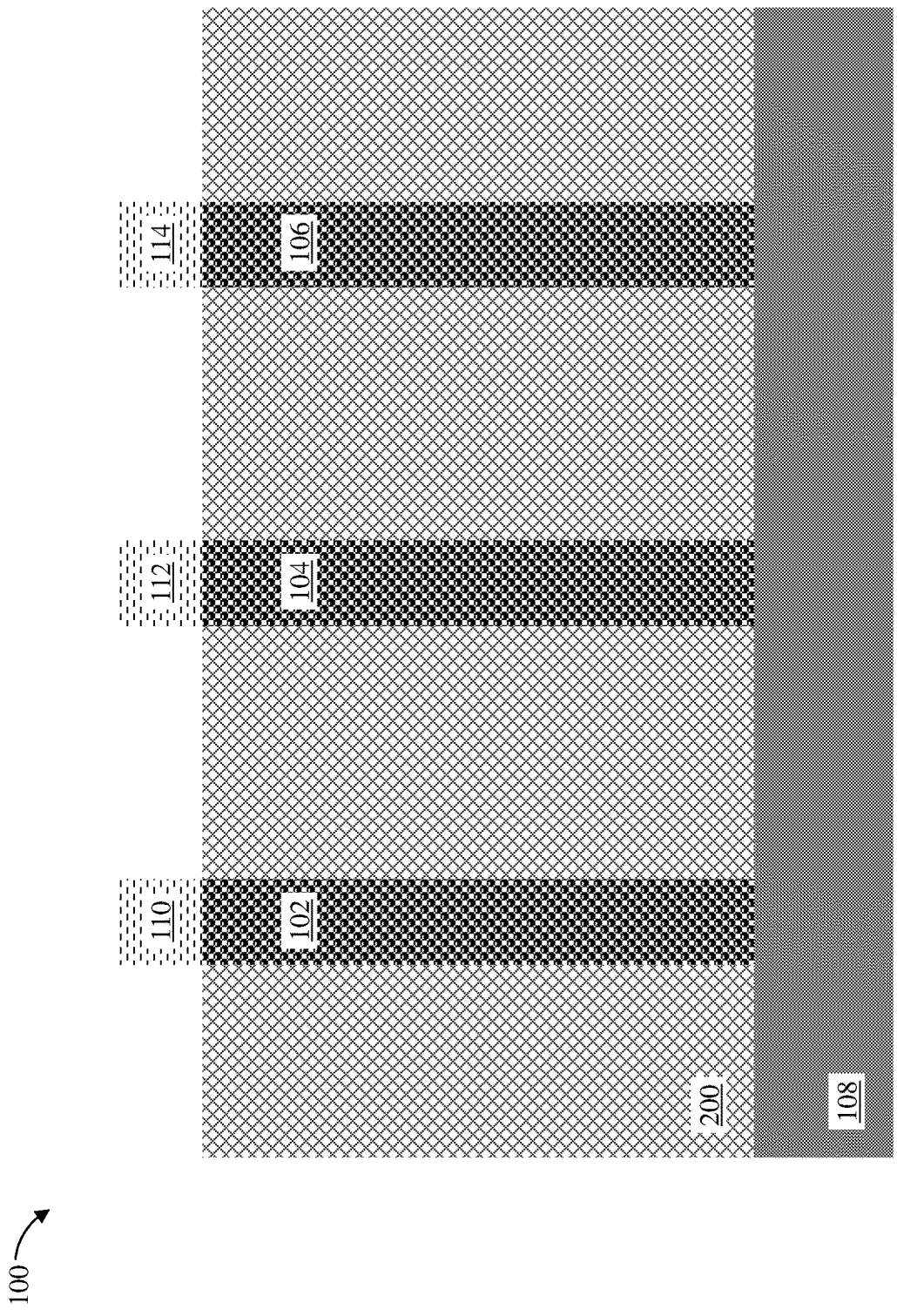
FIG. 3 depicts a cross-sectional view of the structure after recessing the first dielectric layer during an intermediate operation of a method of fabricating a semiconductor device according to one or more embodiments of the present invention.

FIG. 3 illustrates a cross-sectional view of the structure 100 after recessing the first dielectric layer 200 during an intermediate operation of a method of fabricating a semiconductor device according to one or more embodiments. In some embodiments, the first dielectric layer 200 is recessed to the top surfaces of the sacrificial gates 102, 104, and 106. In some embodiments, the first dielectric layer 200 is recessed to a height slightly below the top surfaces of the sacrificial gates 102, 104, and 106. In some embodiments, the first dielectric layer 200 is recessed to a height of about 1 nm to about 3 nm below the top surfaces of the sacrificial gates 102, 104, and 106. In this manner, the extra height of the top surfaces of the sacrificial gates 102, 104, and 106 serves as an additional dielectric buffer for downstream removal operations. Any known manner of recessing the first dielectric layer 200 can be utilized, such as, for example, a wet or dry etch. In some embodiments, the first dielectric layer 200 is etched selective to the hard masks 110, 112, and 114.

Figure 4:
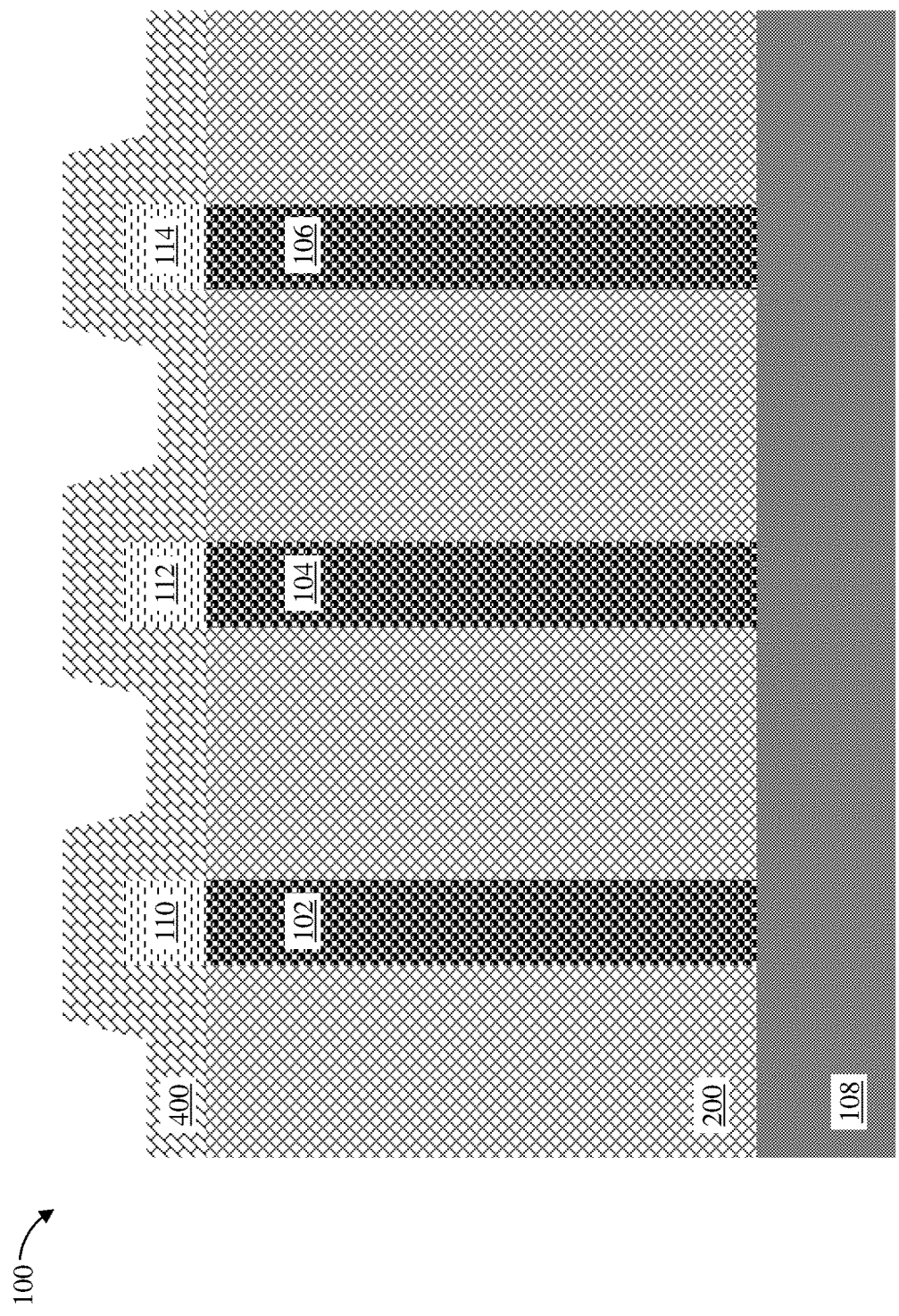
FIG. 4 depicts a cross-sectional view of the structure after forming a protection layer over the first dielectric layer and the hard masks during an intermediate operation of a method of fabricating a semiconductor device according to one or more embodiments of the present invention.

FIG. 4 illustrates a cross-sectional view of the structure 100 after forming a protection layer 400 over the first dielectric layer 200 and the hard masks 110, 112, and 114 during an intermediate operation of a method of fabricating a semiconductor device according to one or more embodiments. The protection layer 400 can be of any suitable material, such as, for example, a silicon nitride, silicon dioxide, SiON, SiC, SiOCN, or SiBCN. In some embodiments, the protection layer 400 is silicon dioxide. The protection layer 400 can be formed using any known process, such as, for example, CVD, PECVD, ALD, PVD, chemical solution deposition, or other like processes in combination with a wet or dry etch process. In some embodiments, the protection layer 400 is conformally formed over the first dielectric layer 200 and the hard masks 110, 112, and 114. In some embodiments, the protection layer 400 is conformally formed using ALD followed by directional RIE.

Figure 5:
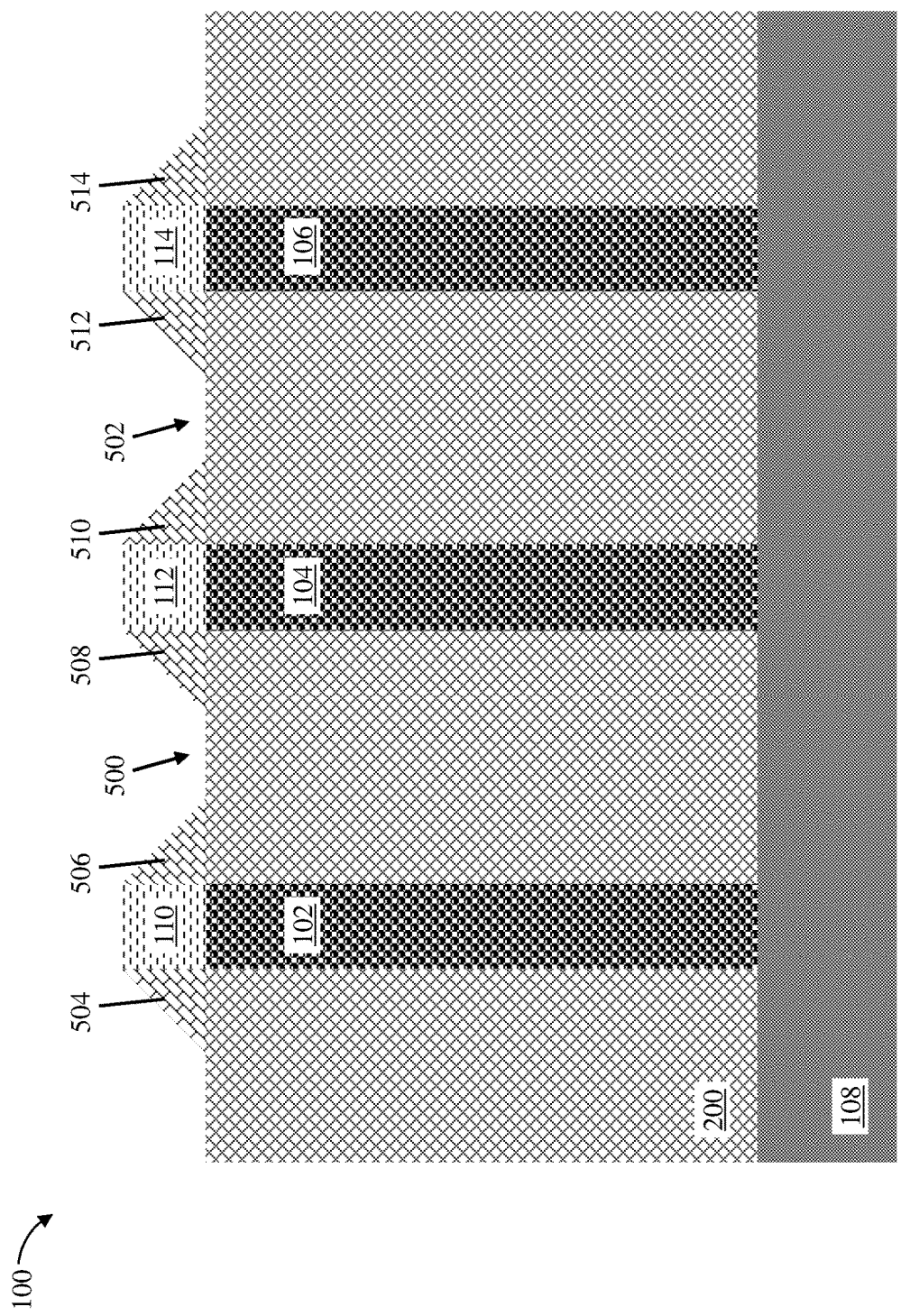
FIG. 5 depicts a cross-sectional view of the structure after removing portions of the protection layer to expose surfaces of the first dielectric layer between each pair of adjacent sacrificial gates during an intermediate operation of a method of fabricating a semiconductor device according to one or more embodiments of the present invention.

FIG. 5 illustrates a cross-sectional view of the structure 100 after removing portions of the protection layer 400 to expose surfaces 500 and 502 of the first dielectric layer 200 between each pair of adjacent sacrificial gates (e.g., surface 500 between sacrificial gates 102 and 104, and surface 502 between sacrificial gates 104 and 106) during an intermediate operation of a method of fabricating a semiconductor device according to one or more embodiments. The regions of the first dielectric layer 200 beneath the surfaces 500 and 502 are exposed regions. The remaining portions 504, 506, 508, 510, 512, and 514 of the protection layer 400 define self-aligned protection layers (and are referred to hereinafter as "self-aligned protection layers" 504, 506, 508, 510, 512, and 514). For ease of discussion only surfaces 500 and 502 and self-aligned protection layers 504, 506, 508, 510, 512, and 514 are depicted. It is understood, however, that an exposed surface and self-aligned protection layers can be formed between each of the pairs of adjacent sacrificial gates. In some embodiments, a thickness of the self-aligned protection layers 504, 506, 508, 510, 512, and 514 is about 3 nm to about 8 nm.

Figure 6:
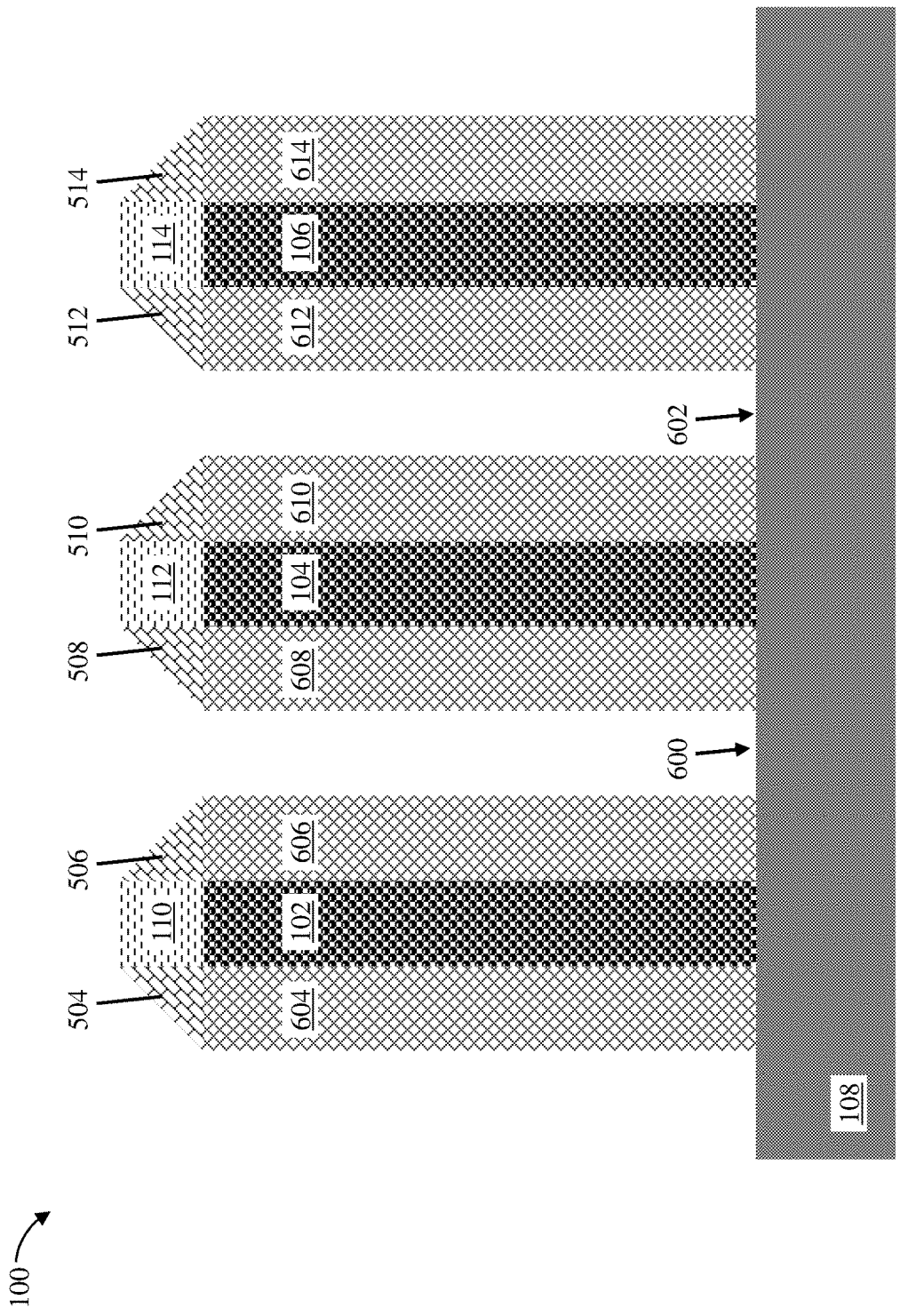
FIG. 6 depicts a cross-sectional view of the structure after removing portions of the first dielectric layer to expose surfaces of the substrate during an intermediate operation of a method of fabricating a semiconductor device according to one or more embodiments of the present invention.

FIG. 6 illustrates a cross-sectional view of the structure 100 after removing portions of the first dielectric layer 200 to expose surfaces 600 and 602 of the substrate 108 during an intermediate operation of a method of fabricating a semiconductor device according to one or more embodiments. The surface 600 of the substrate 108 is between the sacrificial gates 102 and 104. The surface 602 of the substrate 108 is between the sacrificial gates 104 and 106. Spacers 604, 606, 608, 610, 612, and 614 (i.e., the remaining portions of the first dielectric layer 200) are each formed on a sidewall of a sacrificial gate (e.g., spacer 608 is formed on a sidewall of the sacrificial gate 104). Any known manner of removing portions of the first dielectric layer 200 can be utilized, such as, for example, a wet or dry etch. In some embodiments, the first dielectric layer 200 is etched selective to the self-aligned protection layers 504, 506, 508, 510, 512, and 514 and the hard masks 110, 112, and 114. In some embodiments, portions of the first dielectric layer 200 are removed using RIE selective to the self-aligned protection layers 504, 506, 508, 510, 512, and 514. In some embodiments, a thickness of each of the spacers 604, 606, 608, 610, 612, and 614 is substantially equal. In some embodiments, the thickness of each of the spacers 604, 606, 608, 610, 612, and 614 is about 10 nm to about 100 nm. In some embodiments, the thickness of each of the spacers 604, 606, 608, 610, 612, and 614 is about 10 nm to about 30 nm.

Figure 7:
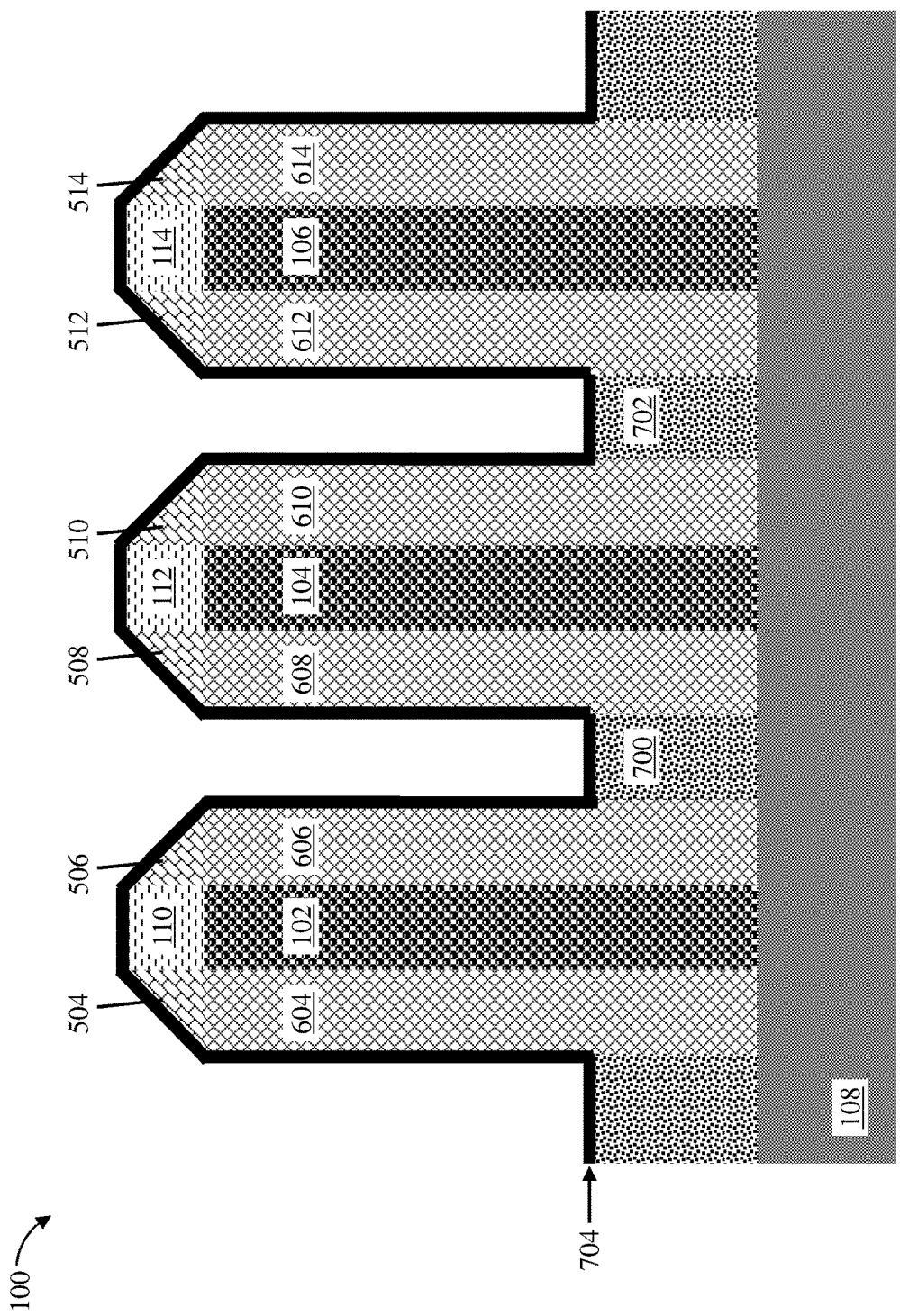
FIG. 7 depicts a cross-sectional view of the structure after forming doped regions on the substrate during an intermediate operation of a method of fabricating a semiconductor device according to one or more embodiments of the present invention.

FIG. 7 illustrates a cross-sectional view of the structure 100 after forming doped regions 700 and 702 on the substrate 108 during an intermediate operation of a method of fabricating a semiconductor device according to one or more embodiments. Doped region 700 is formed between the sacrificial gates 102 and 104 and doped region 702 is formed between the sacrificial gates 104 and 106. In some embodiments, doped regions 700 and 702 are raised above a surface of the substrate 108. For ease of discussion only doped regions 700 and 702 are provided with reference numbers. It is understood, however, that a doped region can be formed between each of the pairs of adjacent sacrificial gates.

The doped regions 700 and 702 can be source or drain regions formed on the substrate 108 by a variety of methods, such as, for example, diffusion, ion implantation of a dopant into the substrate, or in-situ doped epitaxy. In some embodiments, epitaxial growth, CVD, ECD, MBE, or ALD is employed to form the doped regions 700 and 702. In some embodiments, the doped regions 700 and 702 are epitaxially formed using ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), or limited reaction processing CVD (LRPCVD). Epitaxial materials can be grown from gaseous or liquid precursors. Epitaxial materials can be grown using vapor-phase epitaxy (VPE), MBE, liquid-phase epitaxy (LPE), or other suitable process. The doped regions 700 and 702 can be doped during deposition (e.g., in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm-3 to $2\times10^{21}$ cm$^{-3}$, or between $2\times10^{20}$ cm$^{-3}$ and $1\times10^{21}$ cm$^{-3}$.

In some embodiments, a liner 704 is conformally formed over the doped regions 700 and 702, the spacers 604, 606, 608, 610, 612, and 614, and the hard masks 110, 112, and 114. Any known manner of forming the liner 704 can be utilized, such as, for example, conformal ALD. In some embodiments, the liner 704 is a silicon nitride liner. In some embodiments, the liner 704 is conformally formed to a thickness of about 2 nm to about 3 nm.

Figure 8:
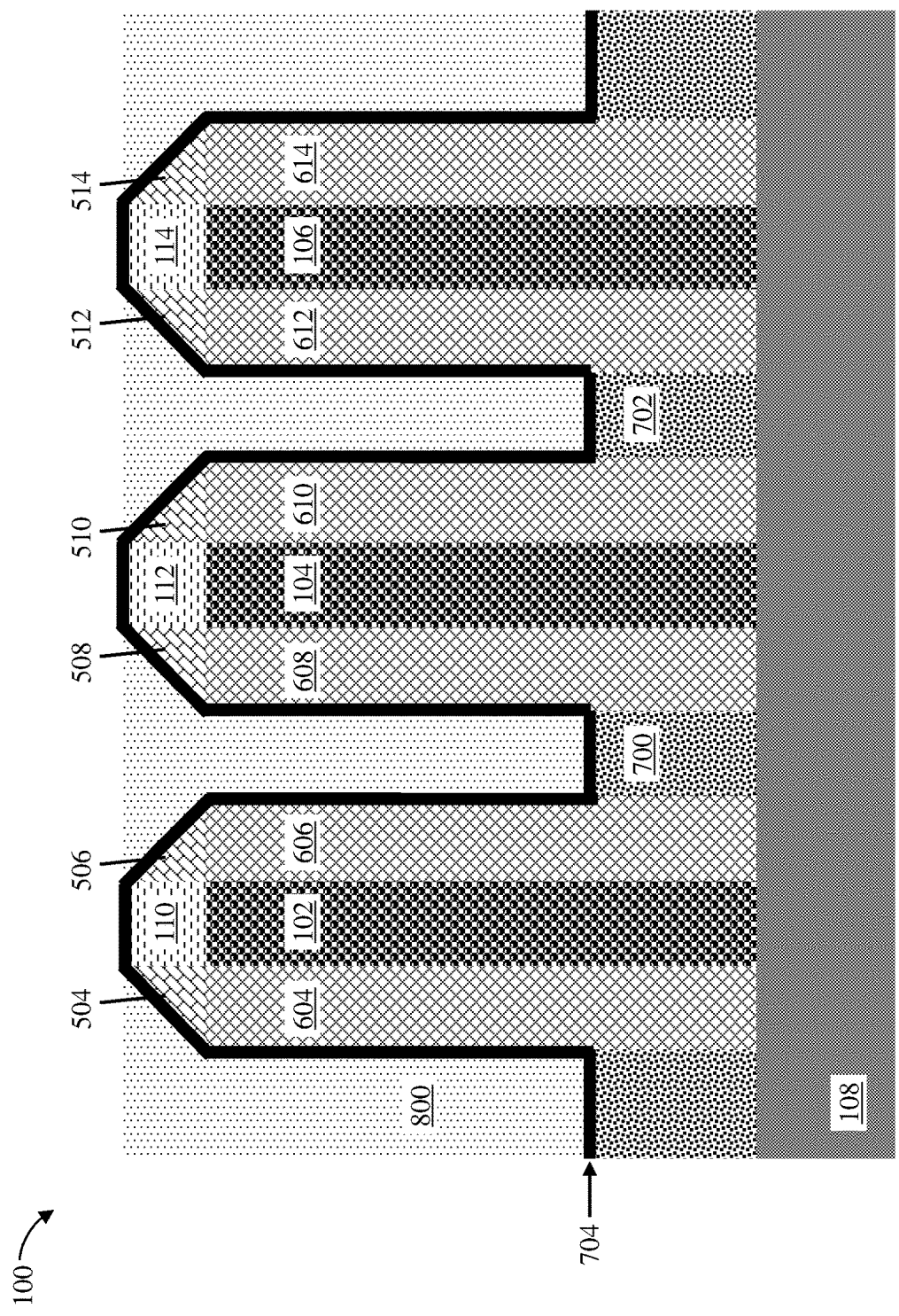
FIG. 8 depicts a cross-sectional view of the structure after forming a second dielectric layer over the doped regions during an intermediate operation of a method of fabricating a semiconductor device according to one or more embodiments of the present invention.

FIG. 8 illustrates a cross-sectional view of the structure 100 after forming a second dielectric layer 800 over the doped regions 700 and 702 during an intermediate operation of a method of fabricating a semiconductor device according to one or more embodiments. The second dielectric layer 800 can be any suitable material, such as, for example, a low-k dielectric, a silicon nitride, silicon dioxide, SiON, SiC, SiOCN, SiBCN, or other dielectric materials. Any known manner of forming the second dielectric layer 800 can be utilized. The second dielectric layer 800 can be formed using, for example, CVD, PECVD, ALD, flowable CVD, spin-on dielectrics, or PVD. In some embodiments, the second dielectric layer 800 is formed by a flowable oxide deposition. In some embodiments, the second dielectric layer 800 is overfilled above a top surface of each of the hard masks 110, 112, and 114 and then planarized to the top surface of the hard masks 110, 112, and 114, using, for example, a CMP operation. In some embodiments, the CMP operation is selective to the hard masks 110, 112, and 114. In some embodiments, the second dielectric layer 800 is planarized using a wet or dry etch process. In some embodiments, the second dielectric layer 800 is planarized using RIE.

Figure 9:
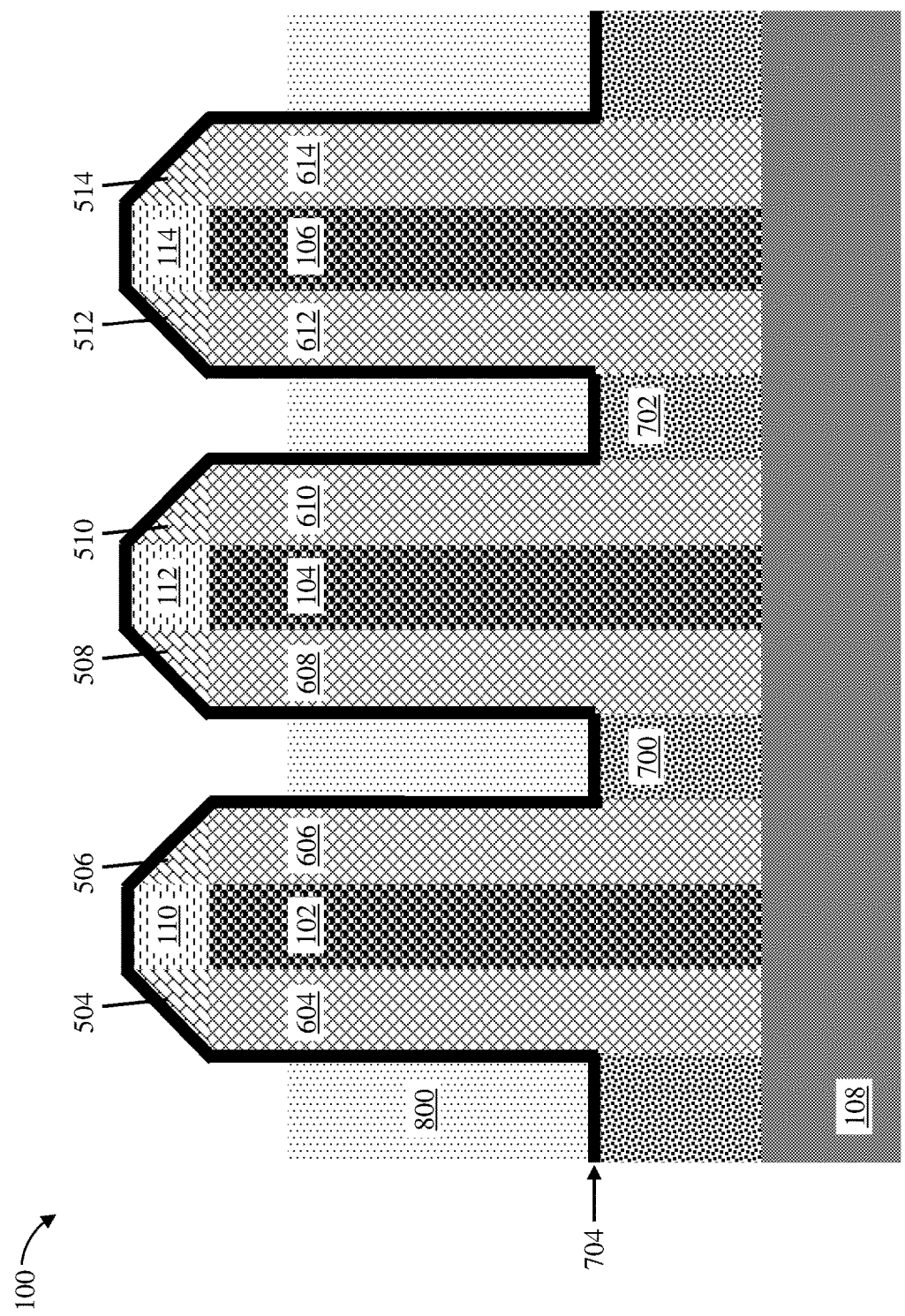
FIG. 9 depicts a cross-sectional view of the structure after recessing the second dielectric layer to expose portions of the spacers during an intermediate operation of a method of fabricating a semiconductor device according to one or more embodiments of the present invention.

FIG. 9 illustrates a cross-sectional view of the structure 100 after recessing the second dielectric layer 800 to expose portions of the spacers 604, 606, 608, 610, 612, and 614 during an intermediate operation of a method of fabricating a semiconductor device according to one or more embodiments. Any known manner of recessing the second dielectric layer 800 can be utilized, such as, for example, a wet or dry etch.

Figure 10:
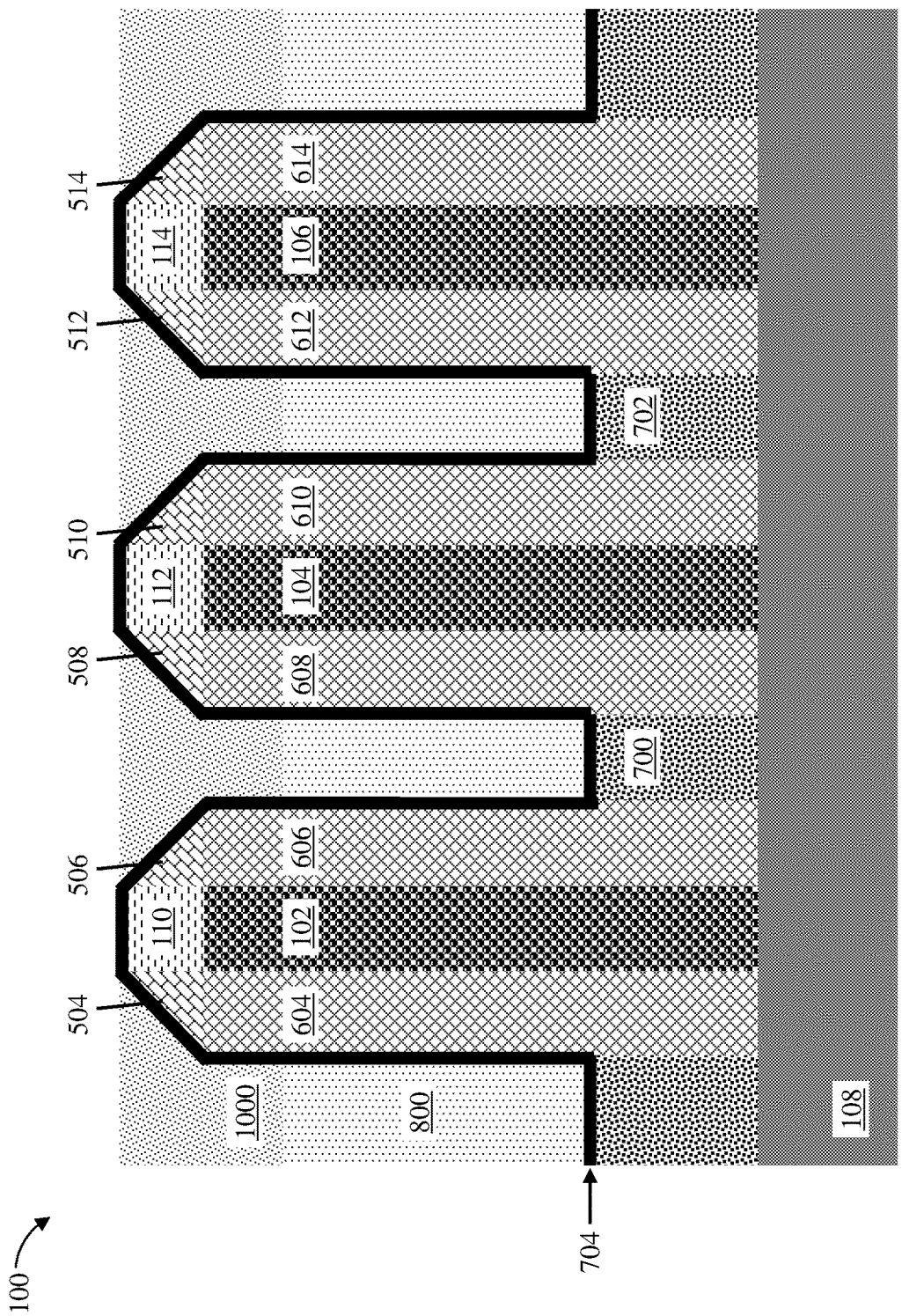
FIG. 10 depicts a cross-sectional view of the structure after forming a third dielectric layer on the second dielectric layer and planarizing the third dielectric layer to a surface of the hard masks during an intermediate operation of a method of fabricating a semiconductor device according to one or more embodiments of the present invention.

FIG. 10 illustrates a cross-sectional view of the structure 100 after forming a third dielectric layer 1000 on the second dielectric layer 800 and planarizing the third dielectric layer 1000 to a surface of the hard masks 110, 112, and 114 during an intermediate operation of a method of fabricating a semiconductor device according to one or more embodiments. The third dielectric layer 1000 can be formed using any known process, such as, for example, PECVD. In some embodiments, the third dielectric layer 1000 is formed using high density plasma (HDP). The third dielectric layer 1000 can be of any suitable material, such as, for example, silicon dioxide. In some embodiments, the second dielectric layer 800 is a flowable oxide and the third dielectric layer 1000 serves as a hard dielectric layer for downstream processing.

Figure 11:
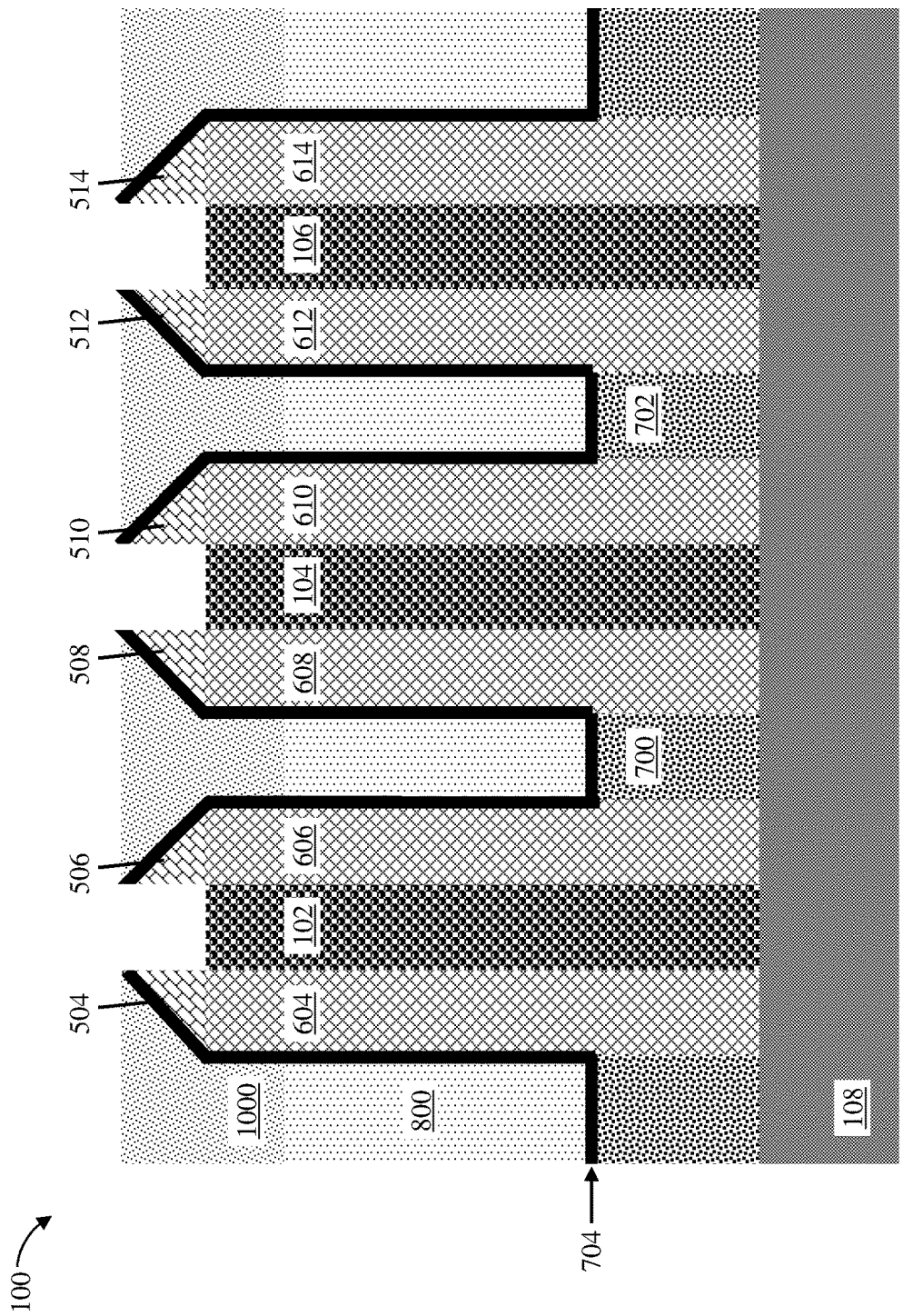
FIG. 11 depicts a cross-sectional view of the structure after removing the hard masks during an intermediate operation of a method of fabricating a semiconductor device according to one or more embodiments of the present invention.

FIG. 11 illustrates a cross-sectional view of the structure 100 after removing the hard masks 110, 112, and 114 during an intermediate operation of a method of fabricating a semiconductor device according to one or more embodiments. Any known manner of removing the hard masks 110, 112, and 114 can be utilized, such as, for example, a wet or dry etch. In some embodiments, the hard masks 110, 112, and 114 are removed using RIE selective to the third dielectric layer 1000 and the self-aligned protection layers 504, 506, 508, 510, 512, and 514. In this manner, the spacers 604, 606, 608, 610, 612, and 614 are protected while the hard masks 110, 112, and 114 are removed. Consequently, no spacer divots are formed.

Figure 12:
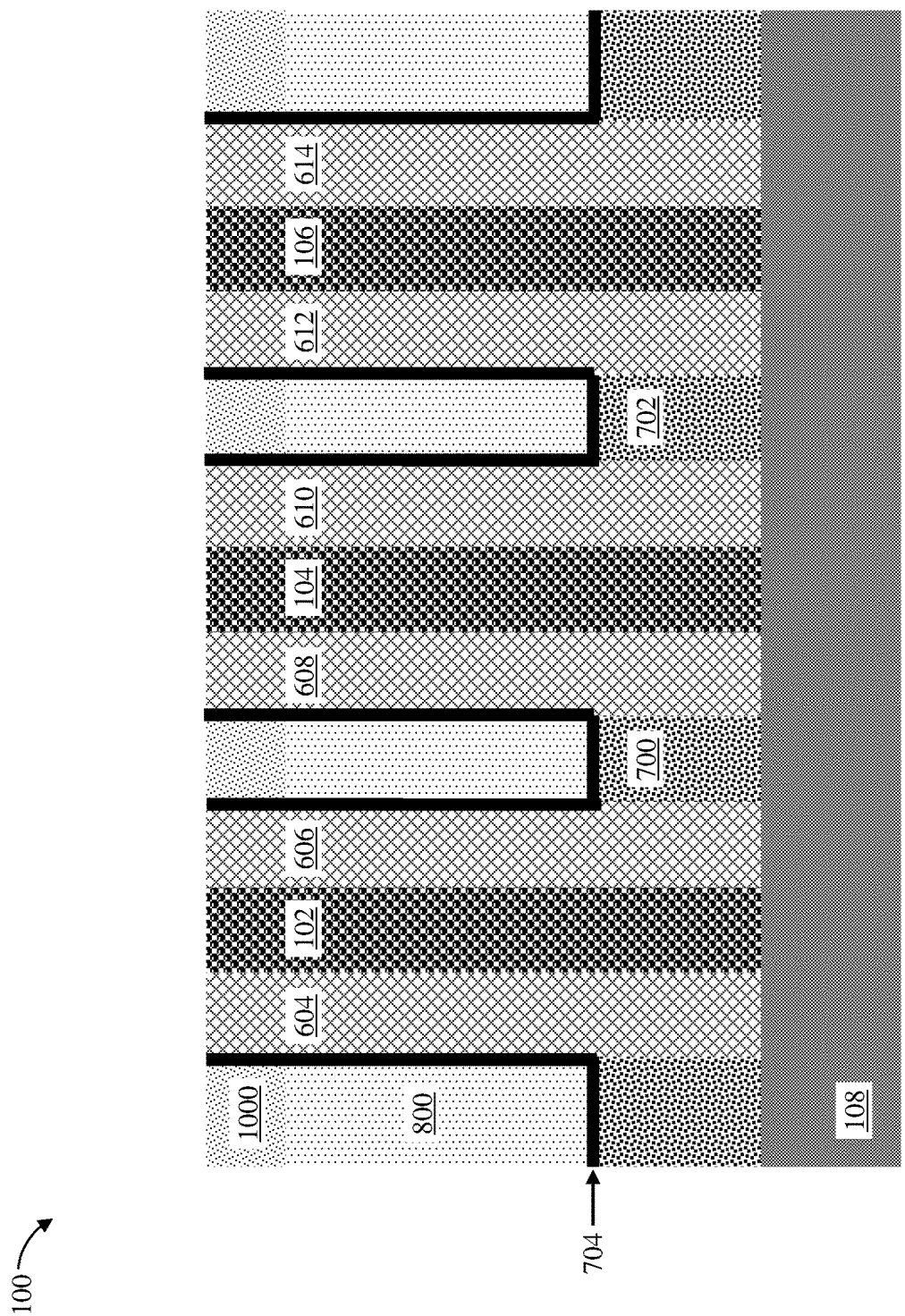
FIG. 12 depicts a cross-sectional view of the structure after removing the self-aligned protection layers and portions of the third dielectric layer to expose top surfaces of the spacers during an intermediate operation of a method of fabricating a semiconductor device according to one or more embodiments of the present invention.

FIG. 12 illustrates a cross-sectional view of the structure 100 after removing the self-aligned protection layers 504, 506, 508, 510, 512, and 514 and portions of the third dielectric layer 1000 to expose top surfaces of the spacers 604, 606, 608, 610, 612, and 614 during an intermediate operation of a method of fabricating a semiconductor device according to one or more embodiments. Any known manner of removing the self-aligned protection layers 504, 506, 508, 510, 512, and 514 can be utilized, such as, for example, a wet or dry etch. In some embodiments, CMP is used to both remove the self-aligned protection layers 504, 506, 508, 510, 512, and 514 and to planarize the third dielectric layer 1000 to a top surface of the sacrificial gates 102, 104, and 106. In some embodiments, the spacers 604, 606, 608, 610, 612, and 614 are also planarized to the top surface of the sacrificial gates 102, 104, and 106.

Figure 13:
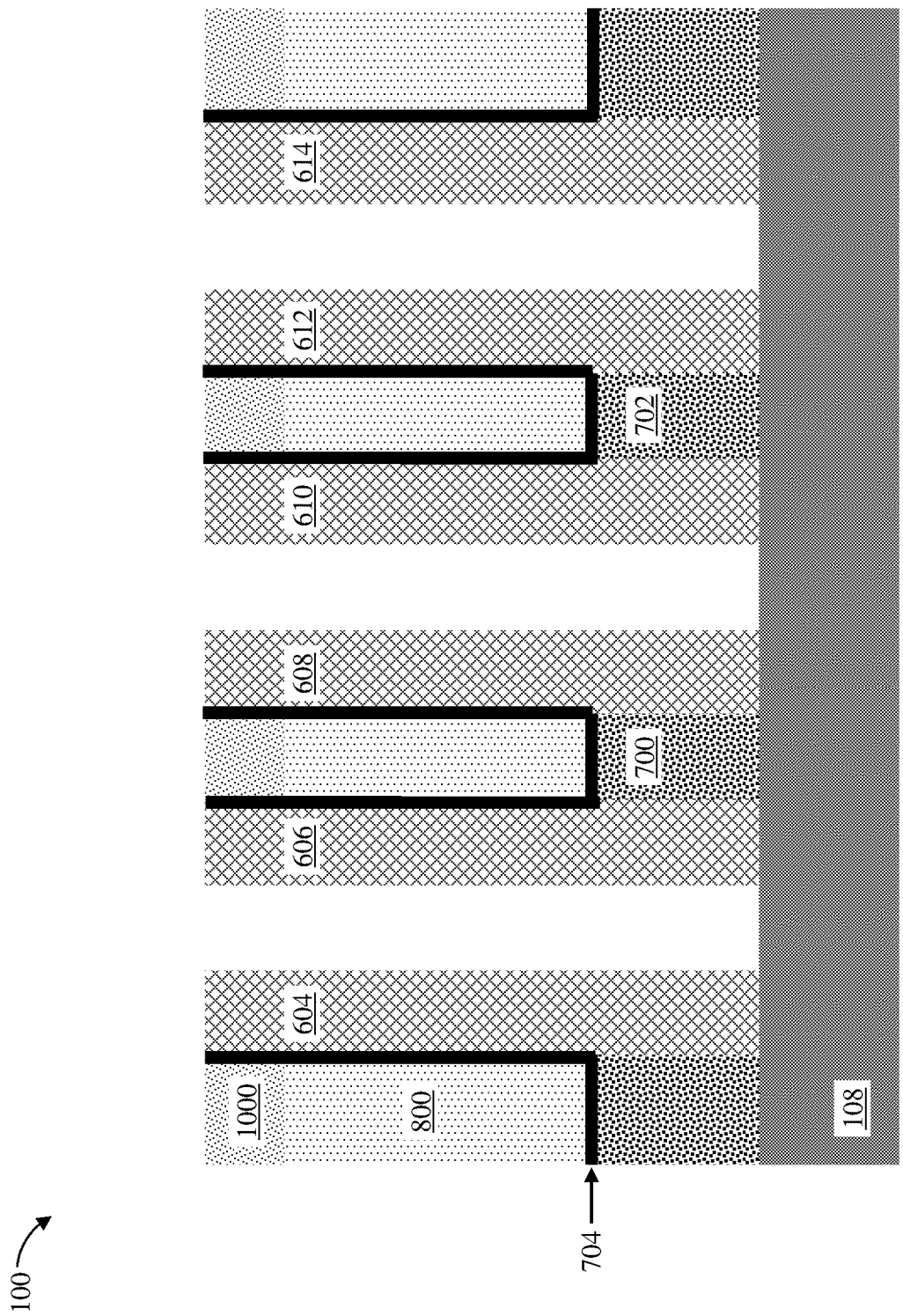
FIG. 13 depicts a cross-sectional view of the structure after removing the sacrificial gates to expose surfaces of the substrate during an intermediate operation of a method of fabricating a semiconductor device according to one or more embodiments of the present invention.

FIG. 13 illustrates a cross-sectional view of the structure 100 after removing the sacrificial gates 102, 104, and 106 to expose surfaces of the substrate 108 during an intermediate operation of a method of fabricating a semiconductor device according to one or more embodiments. Any known manner of removing the sacrificial gates 102, 104, and 106 can be utilized, such as, for example, a wet or dry etch. In some embodiments, the sacrificial gates 102, 104, and 106 are removed using RIE selective to the spacers 604, 606, 608, 610, 612, and 614. The sacrificial gates 102, 104, and 106 can be replaced with conductive gates (not depicted) using known processes. The conductive gates can be formed over channel regions of semiconductor fins (not depicted) using known processes.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:
    forming a sacrificial gate on a substrate;
    forming a dielectric layer comprising a first portion and a second portion, the dielectric layer on the substrate and above a top surface of the sacrificial gate, the first portion in direct contact with sidewalls of the sacrificial gate and between the sidewalls of the sacrificial gate and the second portion;
    recessing the dielectric layer;
    forming a self-aligned protection region to cover the first portion of the dielectric layer; and
    removing the second portion of the dielectric layer to expose a surface of the substrate.

2. The method of claim 1, wherein the first portion of the dielectric layer defines a spacer after the second portion of the dielectric layer is removed.

3. The method of claim 2 further comprising forming a hard mask on a top surface of the sacrificial gate.

4. The method of claim 3 further comprising removing the hard mask; wherein the self-aligned protection region protects the spacer while the hard mask is removed.

5. The method of claim 3, wherein forming the self-aligned protection region further comprises:

forming a protection layer over the first and second portions of the dielectric layer and the hard mask; and removing portions of the protection layer to expose the second portion of the dielectric layer, the remaining portion of the protection layer defining the self-aligned protection region.

6. The method of claim 2 further comprising forming a doped region on the substrate adjacent to the sacrificial gate.

7. The method of claim 6 further comprising forming a second dielectric layer over the doped region and the hard mask.

8. The method of claim 7 further comprising removing portions of the second dielectric layer to expose a portion of the spacer.

9. The method of claim 8 further comprising forming a third dielectric layer on the second dielectric layer and the spacer.

10. The method of claim 9 further comprising:
removing the self-aligned protection region and portions of the third dielectric layer to expose a top surface of the spacer; and
removing the sacrificial gate.

11. The method of claim 2, wherein the spacer is a self-aligned low-k dielectric spacer.

12. The method of claim 2, wherein the spacer comprises a silicon nitride, a silicon oxynitride (SiON), a silicon carbide (SiC), a silicon oxygen carbonitride (SiOCN), or a silicoboron carbonitride (SiBCN).

13. The method of claim 1, wherein the self-aligned protection region comprises silicon dioxide ($SiO_2$).

14. The method of claim 2, wherein a thickness of the spacer is about 10 nm to about 30 nm.

15. A method for forming a semiconductor device, the method comprising:
forming a sacrificial gate on a substrate, the sacrificial gate comprising a hard mask, a sidewall spacer, and a self-aligned protection region formed over the sidewall spacer and adjacent to the hard mask; and
removing the hard mask, the self-aligned protection region protecting the sidewall spacer while the hard mask is removed.

16. The method of claim 15 further comprising forming a doped region on the substrate and adjacent to the sacrificial gate.

17. The method of claim 16 further comprising forming a second dielectric layer over the doped region.

18. The method of claim 17 further comprising recessing the second dielectric layer to expose a portion of the sidewall spacer.

19. The method of claim 18 further comprising forming a third dielectric layer on the recessed second dielectric layer.

20. The method of claim 19 further comprising removing the self-aligned protection region and portions of the third dielectric layer to expose a top surface of the sidewall spacer.

* * * * *